United States Patent
Chang et al.

(10) Patent No.: US 8,580,379 B2
(45) Date of Patent: Nov. 12, 2013

(54) COATING, ARTICLE COATED WITH COATING, AND METHOD FOR MANUFACTURING ARTICLE

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW);
Chuang Ma, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 189 days.

(21) Appl. No.: 13/007,706

(22) Filed: Jan. 17, 2011

(65) Prior Publication Data
US 2012/0034487 A1 Feb. 9, 2012

(30) Foreign Application Priority Data
Aug. 4, 2010 (CN) .......................... 2010 1 0244728

(51) Int. Cl.
*B32B 9/00* (2006.01)

(52) U.S. Cl.
USPC ........... 428/336; 428/469; 428/472; 428/697; 428/698; 428/699

(58) Field of Classification Search
USPC .................. 428/336, 469, 472, 697, 698, 699
See application file for complete search history.

(56) References Cited

PUBLICATIONS

Musil et al "ZrN/Cu nanocomposite film—a novel superhard material" Suface & Coating Tech 120-121 (1999) p. 179-183.*
Musil et al "Magnetron sputtering of hard nanocompsite coatings and their propertites" Suface & Coating Tech 142-144 (2001) p. 557-566.*
Musil et al "Structure and microhardness of magnetron sputtered ZrCu and ZrCu-N films" Vacuum 52 (1999) p. 269-275.*
Zeman et al "Structure and properties of hard and superhard Zr-Cu-N nanocompsite coatigns" Materials Science & Engerring A289 (2000) p. 189-197.*

* cited by examiner

*Primary Examiner* — Archene Turner
(74) *Attorney, Agent, or Firm* — Altis & Wispro Law Group, Inc.

(57) ABSTRACT

A coating includes a nano-composite layer including an equal number of films. The films are stacked on top of each other one after another. Each film includes a zirconium-copper carbonitride layer and a zirconium carbonitride layer.

7 Claims, 4 Drawing Sheets

COATING, ARTICLE COATED WITH COATING, AND METHOD FOR MANUFACTURING ARTICLE

The present application is related to co-pending U.S. patent application Ser. No. 13/007,707, entitled "COATING, ARTICLE COATED WITH COATING, AND METHOD FOR MANUFACTURING ARTICLE", by Zhang et al. This application has the same assignee as the present application and has been concurrently filed herewith. The above-identified applications are incorporated herein by reference.

BACKGROUND

1. Technical Field

The exemplary disclosure generally relates to coatings, and particularly relates to articles coated with the coatings and a method for manufacturing the articles.

2. Description of Related Art

Physical vapor deposition (PVD) has conventionally been used to form a coating on metal bases of cutting tools or molds. Materials used for this coating material are required to have good durability. At present, Zirconium carbonitride (ZrCN) is used as a material satisfying these requirements. However, ZrCN poorly adheres to metal properties and may easily peel off.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coating, article coated with the coating and method for manufacturing the article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
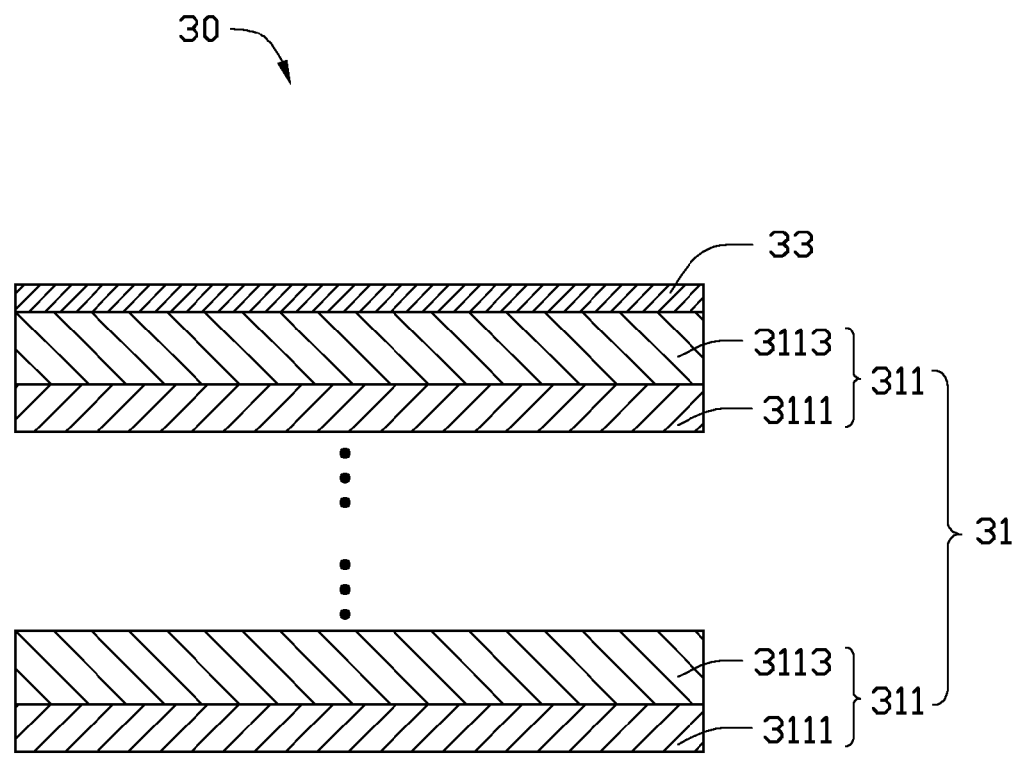
FIG. 1 is a cross-sectional view of an exemplary embodiment of a coating.

A coating 30 includes a nano-composite layer 31, which includes a number of films 311. The films 311 are stacked on top of each other. Each film 311 includes a zirconium-copper carbonitride (ZrCuCN) layer 3111 and a zirconium carbonitride (ZrCN) layer 3113. In other words, the nano-composite layer 31 includes an equal number of ZrCuCN layers 3111 and ZrCN layers 3113, and each ZrCuCN layer 3111 alternates with a ZrCN layer 3113. The ZrCuCN layers 3111 and the ZrCN layers 3113 may be deposited by magnetron sputtering or cathodic arc deposition.

In this exemplary embodiment, the number of the films 311 is about 50-60. Each ZrCuCN layer 3111 has a thickness ranging from about 10 nanometers to about 20 nanometers. Each ZrCN layer 3113 has a thickness ranging from about 10 nanometers to about 20 nanometers. The coating 30 has a thickness ranging from about 1 micrometer to about 4 micrometers. The coating 30 may include a color layer 33 covering the nano-composite layer 31, to decorate the appearance of the coating 30.

Figure 2:
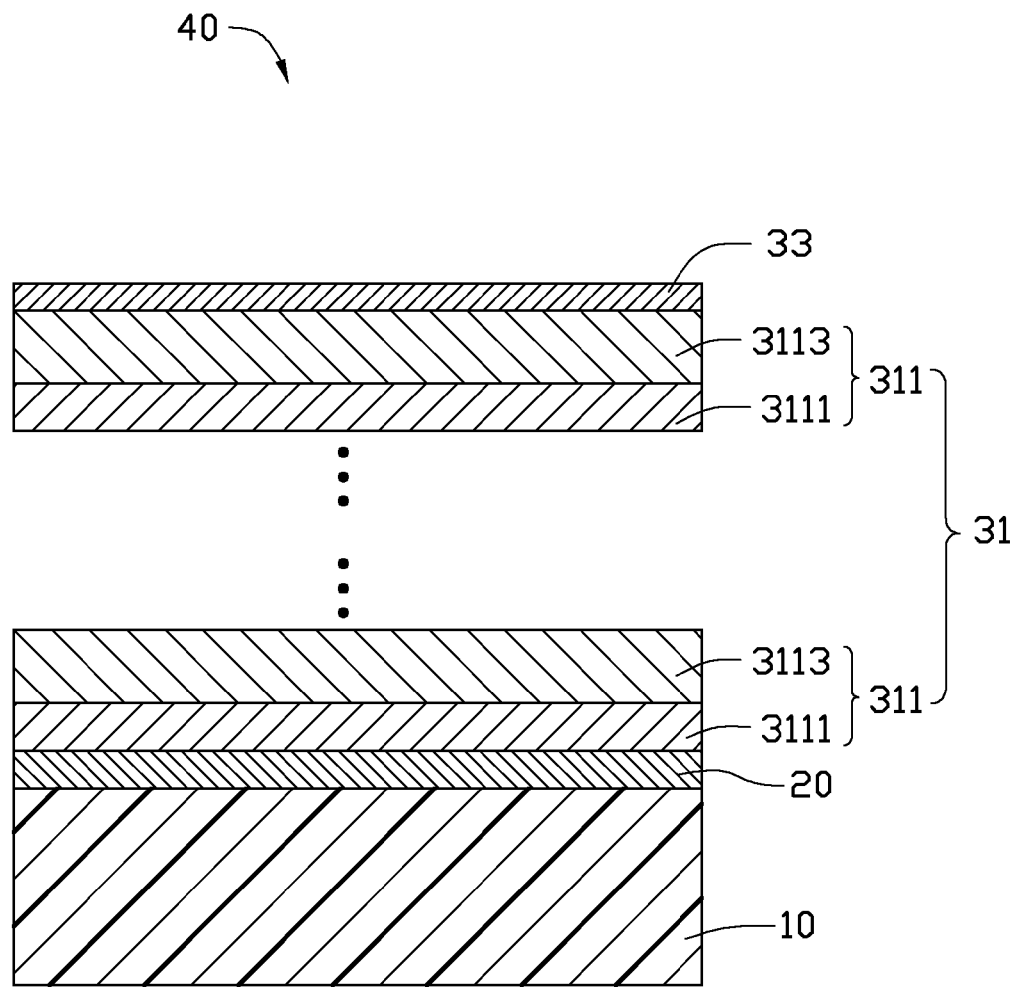
FIG. 2 is a cross-sectional view of an article coated with the coating in FIG. 1.

Referring to FIG. 2, an exemplary article 40 includes a substrate 10, a bonding layer 20 deposited on the substrate 10 and the coating 30 deposited on the bonding layer 20. The substrate 10 is made of metal, such as high speed steel, hard alloy, or stainless steel. The article 40 may be a cutting tool, a mold, or housing for electronic devices. The bonding layer 20 is a zirconium copper (ZrCu) layer. The bonding layer 20 has a thickness ranging from about 0.05 micrometer to about 0.2 micrometer, and preferably has a thickness of 0.1 micrometer. The bonding layer 20 can be deposited by magnetron sputtering or cathodic arc deposition. The chemical stability of the bonding layer 20 is between the chemical stability of the substrate 10 and the chemical stability of the coating 30, and a coefficient of thermal expansion of the bonding layer 20 is between the coefficient of thermal expansion of the substrate 10 and the coefficient of thermal expansion of the coating 30. Thus, the bonding layer 20 improves the binding force between the substrate 10 and the coating 30 so the coating 30 can be firmly deposited on the substrate 10.

Figure 3:
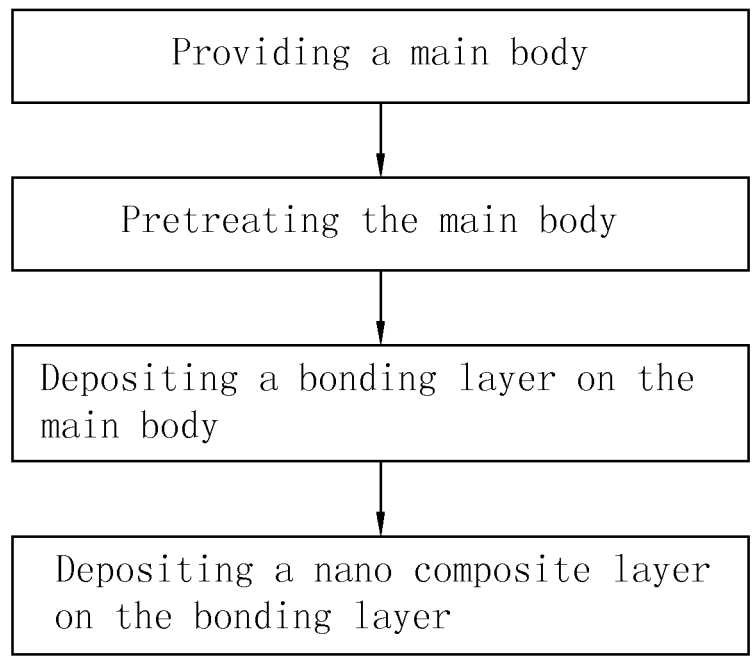
FIG. 3 is a block diagram showing the steps of an exemplary method for manufacturing the article in FIG. 2.
Figure 4:
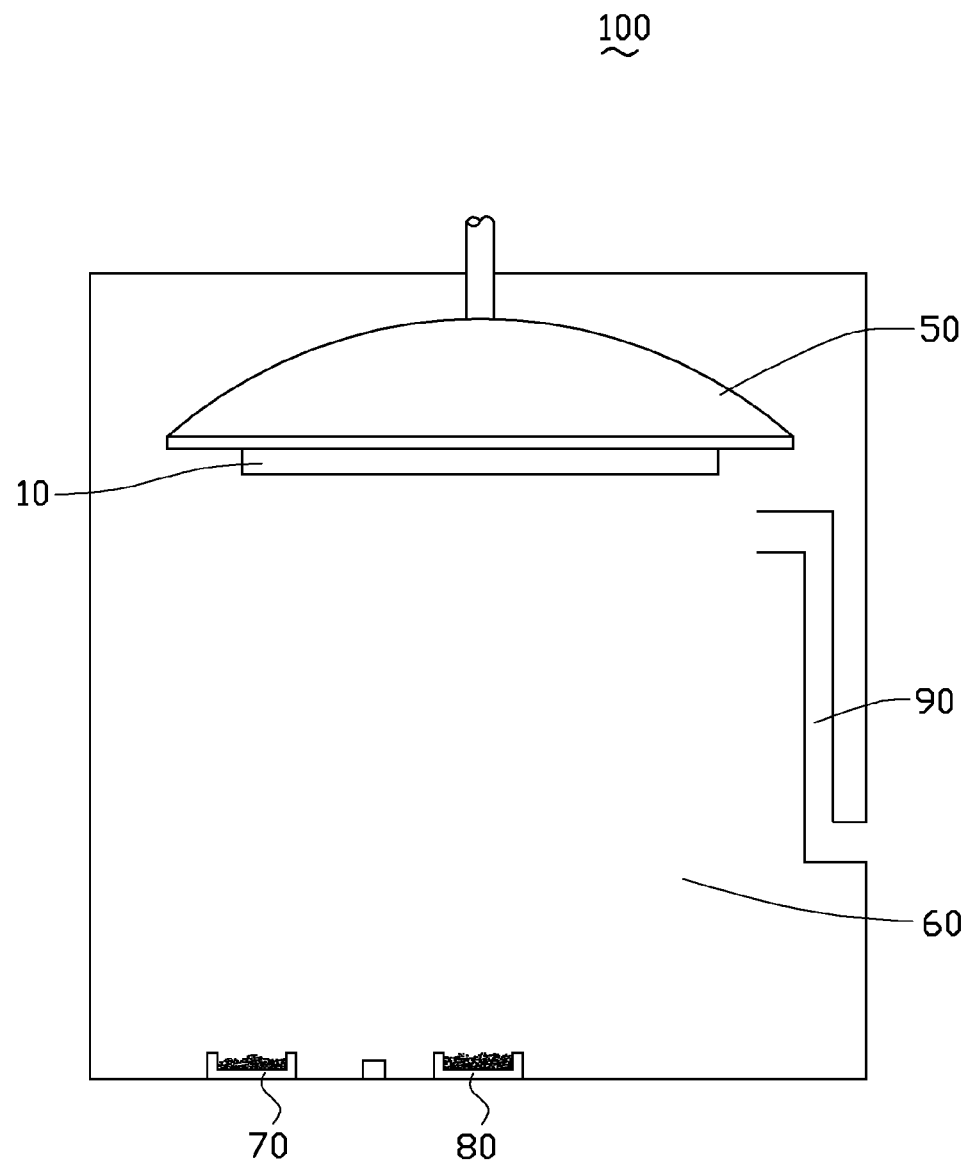
FIG. 4 is a schematic view of a magnetron sputtering coating machine for manufacturing the article in FIG. 2.

Referring to FIG. 3, a method for manufacturing the article 40 includes at least the following steps.

Providing a substrate 10. The substrate 10 may be made of high speed steel, hard alloy, or stainless steel.

Pretreating the substrate 10, the substrate 10 is washed with a solution (e.g., Alcohol or Acetone) in an ultrasonic cleaner, to remove, e.g., grease, dirt, and/or impurities. Then, the substrate 10 is dried. Next, the substrate 10 is cleaned by argon plasma cleaning 10. The substrate 10 is retained on a rotating bracket 50 in a vacuum chamber 60 of a magnetron sputtering coating machine 100. The vacuum level of the vacuum chamber 60 is adjusted to $8.0\times10$-3 Pa. Pure argon is floated into the vacuum chamber 60 at a flux of about 300 Standard Cubic Centimeters per Minute (sccm) to 600 sccm from a gas inlet 90, and a bias voltage is applied to the substrate 10 in a range of −300 to −800 volts for about 3-10 minutes. The substrate 10 is washed by argon plasma, to further remove the grease or dirt. Thus, the binding force between the substrate 10 and the bonding layer 20 is enhanced.

A bonding layer 20 is deposited on the substrate 10. The argon is floated into the vacuum chamber 60 at a flux from about 100 sccm to 300 sccm from the gas inlet 90, in this exemplary embodiment, is about 150 sccm; the speed of the rotating bracket 50 is adjusted to about 0.5 to 4 revolution per minute (rpm), in this exemplary embodiment is about 3 rpm; a power source applied to a zirconium copper alloy target 70 may be in a range of about 7 to 11 kw, in this exemplary embodiment is about 10 kw; a bias voltage applied to the substrate 10 may be in a range of −100 to −300 volts for about 20 to about 60 min, to deposit the bonding layer 20 on the substrate 10. The zirconium copper alloy contains zirconium in a range of about 30 to about 70 wt %.

A nano-composite layer 31 is deposited on the bonding layer 20. Nitrogen is floated into the vacuum chamber 60 at a flux from about 100 sccm to about 200 sccm from the gas inlet 90. Acetylene gas is floated into the vacuum chamber 60 at a flux from about 10 sccm to about 300 sccm from the gas inlet 90. The zirconium copper alloy target 70 and a pure zirconium target 80 in the magnetron sputtering coating machine are alternatively evaporated using a power from 7 kw to 11 kw for about 30 min to about 120 min, alternatively depositing an equal number of ZrCuCN layers 3111 and ZrCN layers 3113 on the bonding layer 20. During the depositing of the ZrCuCN layers 3111, atomic copper and atomic zirconium cannot react to solid solution phase, and atomic copper does not easily react with atomic nitrogen, so atomic nitrogen has a priority reaction with atomic zirconium to form zirconium-nitrogen crystal. Additionally, atomic copper is independent from copper phase, which can prevent the zirconium-nitrogen crystal from enlarging, to maintain the zirconium-nitrogen crystal in nanometer level. The nanometer lever zirconium-nitrogen can improve hardness and toughness of the coating 30.

The color layer 33 may be deposited on the nano-composite layer 31 to improve the appearance of the article 40.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An article, comprising:
a substrate;
a bonding layer deposited on the substrate; and
a coating deposited on the bonding layer, the coating including a nano-composite layer, the nano-composite layer comprising an equal number of zirconium-copper carbonitride and zirconium carbonitride layers, and each zirconium-copper carbonitride layer alternating with one zirconium carbonitride layer; the zirconium-copper carbonitride being formed by magnetron sputtering, using a zirconium-copper alloy target in which the zirconium has a mass percentage of about 30% to about 70%.

2. The article as claimed in claim 1, wherein each zirconium-copper carbonitride layer has a thickness ranging from about 10 nanometer to about 20 nanometer; each zirconium carbonitride layer has a thickness ranging from about 10 nanometer to about 20 nanometer.

3. The article as claimed in claim 1, wherein the coating has a thickness ranging from about 1 micrometer to about 4 micrometer.

4. The article as claimed in claim 1, wherein the coating further comprises a color layer covering on the nano-composite layer.

5. The article as claimed in claim 1, wherein the substrate is made of high speed steel, hard alloy, or stainless steel.

6. The article as claimed in claim 1, wherein the bonding layer is a zirconium copper layer, the bonding layer has a thickness ranging from about 0.05 micrometer to about 0.2 micrometer, the zirconium copper layer is formed by magnetron sputtering, using a zirconium-copper alloy target in which the zirconium has a mass percentage of about 30% to about 70%.

7. The article as claimed in claim 1, wherein the chemical stability of the bonding layer is between the chemical stability of the substrate and the chemical stability of the coating, and the coefficient of thermal expansion of the bonding layer is between the coefficient of thermal expansion of the substrate and the coefficient of thermal expansion of the coating.

* * * * *